United States Patent
Egitto et al.

(10) Patent No.: US 6,607,613 B2
(45) Date of Patent: *Aug. 19, 2003

(54) SOLDER BALL WITH CHEMICALLY AND MECHANICALLY ENHANCED SURFACE PROPERTIES

(75) Inventors: Frank D. Egitto, Binghampton, NY (US); Edmond O. Fey, Vestal, NY (US); Luis J. Matienzo, Endicott, NY (US); David L. Questad, Vestal, NY (US); Rajinder S. Rai, Johnson City, NY (US); Daniel C. Van Hart, Conklin, NY (US)

(73) Assignee: International Business Machines Corporation, Armonk, NY (US)

(*) Notice: Subject to any disclaimer, the term of this patent is extended or adjusted under 35 U.S.C. 154(b) by 91 days.

This patent is subject to a terminal disclaimer.

(21) Appl. No.: 09/775,747
(22) Filed: Feb. 1, 2001
(65) Prior Publication Data

US 2001/0012570 A1 Aug. 9, 2001

Related U.S. Application Data

(60) Continuation-in-part of application No. 09/382,221, filed on Aug. 24, 1999, now Pat. No. 6,210,547, which is a division of application No. 09/302,740, filed on Apr. 30, 1999, now Pat. No. 6,250,540, which is a division of application No. 09/113,445, filed on Jul. 10, 1998, now Pat. No. 6,056,831.

(51) Int. Cl.$^7$ ............................................. C22C 11/06
(52) U.S. Cl. ............ 148/400; 148/241; 148/280; 228/42; 228/205; 228/217; 428/547; 428/610; 204/192.17; 204/192.35
(58) Field of Search .................. 148/400, 241, 148/280; 228/205, 42, 217; 428/547, 610; 204/192.17, 192.35

(56) References Cited

U.S. PATENT DOCUMENTS

| | | | |
|---|---|---|---|
| 4,064,030 A | 12/1977 | Nakai et al. | 204/192 |
| 4,921,157 A | 5/1990 | Dishon et al. | 228/124 |
| 5,000,819 A | 3/1991 | Pedder et al. | 156/643 |
| 5,054,421 A | 10/1991 | Ito et al. | 118/723 |
| 5,108,950 A | 4/1992 | Wakabayashi et al. | 437/183 |
| 5,188,280 A | 2/1993 | Nakao et al. | 228/123 |
| 5,192,582 A | 3/1993 | Liedke et al. | 228/206 |
| 5,244,144 A | 9/1993 | Osame et al. | 228/219 |
| 5,735,451 A | 4/1994 | Mori et al. | 228/206 |
| 5,340,411 A | 8/1994 | Mergele et al. | 148/26 |
| 5,345,056 A | 9/1994 | Frei et al. | 219/121.59 |
| 5,476,726 A | 12/1995 | Harada et al. | 428/643 |
| 5,499,754 A | 3/1996 | Bobbio et al. | 228/206 |
| 5,516,031 A | 5/1996 | Nishikawa et al. | 228/205 |

(List continued on next page.)

FOREIGN PATENT DOCUMENTS

JP 07226400 * 8/1995

OTHER PUBLICATIONS

"Ion Beam Joining Technique" by J.M.E. Harper, et al. J. Vac. Sci. Technol., 20(3), Mar. 1982.
"Thin Film Processes" by John L Vossen et al. Academic Press. 1978. pp. 14–19.
"Ion Milling to Remove Halo" by R.J. Herdzik et al. IBM Technical Disclosure Bulletin. vol. 23, No. 11, Apr. 1981. p. 4920.

(List continued on next page.)

Primary Examiner—Sikyin Ip
(74) Attorney, Agent, or Firm—RatnerPrestia; Ronald Kaschak

(57) ABSTRACT

A metal alloy solder ball comprising a first metal and a second metal, the first metal having a sputtering yield greater than the second metal. The solder ball comprises a bulk portion having a bulk ratio of the first metal to the second metal, an outer surface, and a surface gradient having a depth and a gradient ratio of the first metal to the second metal that is less than the bulk ratio. The gradient ratio increases along the surface gradient depth from a minimum at the outer surface. The solder ball may be formed by the process of exposing the ball to energized ions of a sputtering gas for an effective amount of time to form the surface gradient.

12 Claims, 4 Drawing Sheets

U.S. PATENT DOCUMENTS

| | | | |
|---|---|---|---|
| 5,878,943 A | 11/1996 | Nishikawa et al. | 228/205 |
| 5,609,290 A | 3/1997 | Bobbio et al. | 29/840 |
| 5,634,268 A | 6/1997 | Dalal et al. | 29/840 |
| 5,729,896 A | 3/1998 | Dalal et al. | 29/840 |
| 6,050,481 A * | 4/2000 | Chapman et al. | 228/254 |
| 6,056,831 A | 5/2000 | Egitto et al. | 148/241 |
| 6,092,714 A | 7/2000 | Casey | 228/205 |
| 6,344,234 B1 * | 2/2002 | Dalal et al. | 427/96 |

OTHER PUBLICATIONS

"Ion Milling Technique to Reflow Solder Pads" by R.J. Herdzik et al. IBM Technical Disclosure Bulletin. Apr., 1981. pp. 4915–4916.

"Lift–Off Process For CrCuAu Metallurgy" by R.J. Herdzik et al. IBM Technical Disclosure Bulletin. vol. No. 1, Jun., 1979. pp. 84–85.

"Influence of Mask Materials on Ion–Etched Structures" by H. Dimigen et al. Journal of Vacuum Science Technology. vol. 13, No. 4, Aug., 1976, pp. 976–980.

Koopman et al., "Fluxless, no clean solder processing of components, printed wiring boards, and packages in air and nitrogen", Proc. Surface Mount Int'l Conf., pp. 437–446.

Koopman et al., "Fluxless, no clean assembly of solder bumped flip chips," IEEE, 1996 Elec. Components and Tech. Conf., pp. 552–558.

Coolbaugh et al., "Surface reactions of copper films in O2/CF4/N2 plasmas," Surface and Interface Analysis, 15(2), pp. 119–124.

Nishikawa et al., "Fluxless Soldering Process Technology," IEEE, 1994 Elec. Components and Tech. Conf. pp. 286–292.

* cited by examiner

# SOLDER BALL WITH CHEMICALLY AND MECHANICALLY ENHANCED SURFACE PROPERTIES

CROSS-REFERENCE TO RELATED APPLICATIONS

This application is a continuation-in-part of allowed U.S. patent application Ser. No. 09/382,221, filed on Aug. 24, 1999, now granted as U.S. Pat. No. 6,210,547, which is (a divisional application of Ser. No. 09/113,445 filed on Jul. 10, 1998, now granted as U.S. Pat. No. 6,056,831), and which is a divisional of U.S. patent application Ser. No. 09/302,740, filed on Apr. 30, 1999, now granted as U.S. Pat. No. 6,250,540.

TECHNICAL FIELD

The present invention relates generally to solder balls used in microelectronics and, more specifically, to a solder ball having surface properties enhanced by an ion-bombardment-induced sputtering process.

BACKGROUND OF THE INVENTION

In the manufacture of microelectronic devices, various microelectronic components are electrically joined together into circuits using metal alloy solders. Such solders are generally alloys of tin (Sn) and lead (Pb), but can comprise other metal components. The metal alloy solder is generally optimized for bulk properties that control the thermal behavior of the solder. For example, the melting temperature of Pb/Sn solder is controlled by adjusting the relative amounts of tin and lead in the solder. The minimum melting temperature of a Pb/Sn alloy is achieved when the ratio by weight of Pb to Sn in the solder is 37:63. This is called the eutectic composition.

A solder that is homogenous across its mass and optimized for bulk properties does not take into account the desirable surface properties of the solder. Therefore, solder compositions that are optimized for bulk behavior are not necessarily optimized in terms of surface properties. Such surface properties control wetting to metal surfaces, reactivity with organic materials such as fluxes, and the melting point of the surface layer. Such surface properties depend upon both the chemical composition of the solder and the physical characteristics of the surface. For instance, a rough surface may have more surface area for holding flux than a smooth surface.

For some applications, it is desirable to use bulk solder alloys at other than the eutectic composition. For example, Controlled Collapse Chip Connection (C4) solder balls, which are used to join Integrated Circuit (IC) chips to chip carriers, are typically Pb-rich in the range of 90% to 97% Pb. Because Pb-enriched solders have higher melting temperatures than solders closer to the eutectic composition, the solder joint formed by Pb-enriched solders between the chip and the chip carrier maintains its shape throughout subsequent assembly of the chip carrier (with chip attached) to another electrical component such as a printed circuit board. The Pb-enriched solders also require higher temperatures, however, to fuse them to metal surfaces such as copper pads on chip carriers. Thus, organic laminate chip carriers having copper joining pads may be exposed to undesirable high temperatures during joining processes.

A tradeoff results: without further treatment, the benefit of using a Pb-enriched metal alloy solder that maintains its shape at high temperatures is offset by the need for a high fusing temperature. Such high fusing temperatures can be avoided by applying a eutectic solder to the joining pads on the organic laminate chip carrier. To ensure proper fusing at every joint, however, the height of the applied eutectic solder layer must be controlled within very narrow limits, a requirement that is difficult to satisfy.

Another modification that retains high temperature stability while providing low temperature fusing comprises placement of an additional layer or cap of tin or other low melting point metal on the surface of the Pb-enriched solder, as described in U.S. Pat. Nos. 5,634,268 and 5,729,896 and assigned to the common assignee of the present invention. Such a cap enables the bulk solder to retain its desirable high-temperature resistance while providing a surface layer capable of fusing at low temperatures.

The present invention proposes a solder ball having an integral solder surface layer capable of fusing at low temperatures while maintaining the bulk solder properties.

SUMMARY OF THE INVENTION

The present invention provides a metal alloy solder ball comprising a first metal and a second metal, such as lead and tin respectively, and having a bulk ratio of the first metal to the second metal, the solder ball having enhanced surface properties. The process for enhancing the surface properties comprises exposing the solder ball to energized ions of a sputtering gas for an effective amount of time to form a surface gradient having a depth and a gradient ratio of the first metal to the second metal that is less than the bulk ratio. The gradient ratio increases along the surface gradient depth from a minimum at the outer surface.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

Figure 1A:
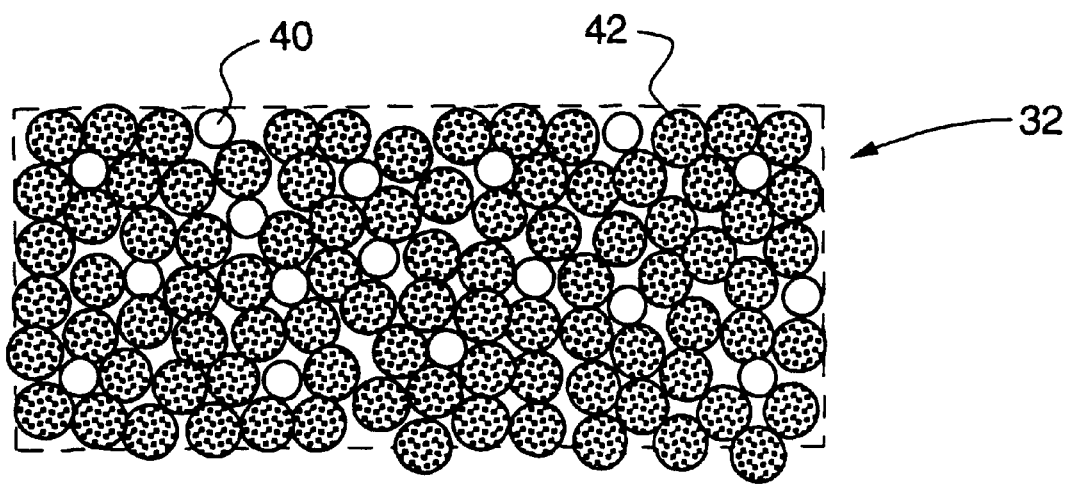
FIG. 1A is an atomic-level, side view cross-section of a portion of a mass of solder, showing a homogenous bulk mixture throughout.
Figure 1B:
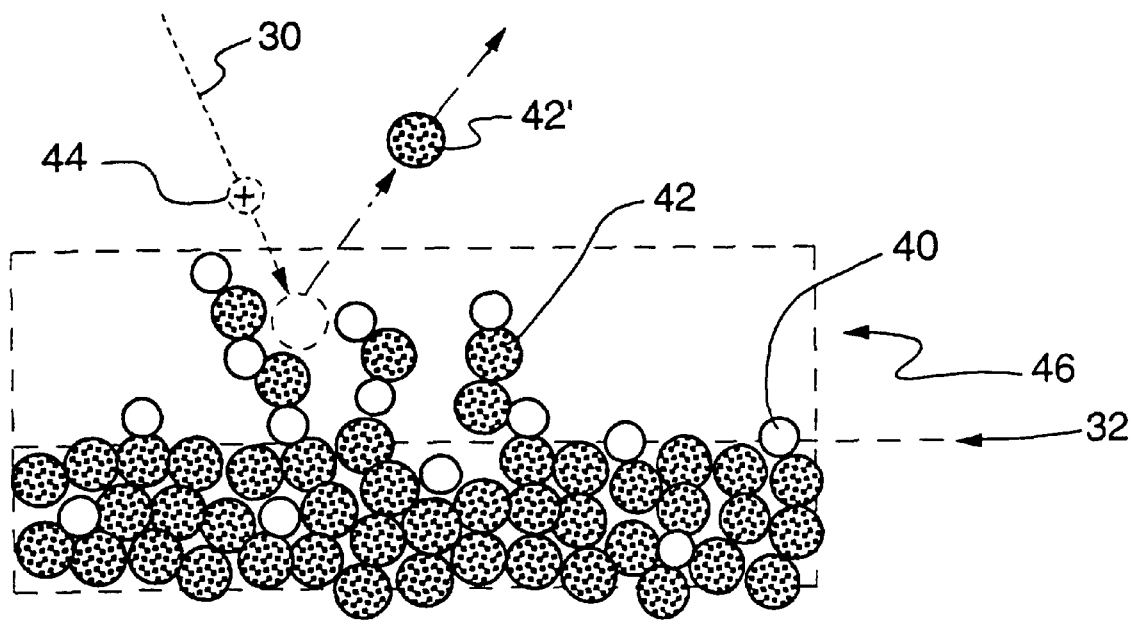
FIG. 1B is an atomic-level, side view cross-section of the same portion of the solder mass shown in FIG. 1A, showing the impact of surface layer modification via ion bombardment.

Referring now to the drawing, in which like reference numbers refer to like elements throughout, FIGS. 1A and 1B show an atomic-level illustration of a portion of a metal alloy solder ball 32. This particular metal alloy solder ball is shown in FIG. 1A having a homogenous composition of Sn atoms 40 and Pb atoms 42. The Pb atoms comprise roughly 90% of the weight of the solder (a bulk ratio of approximately 1:5.16 Sn atoms to Pb atoms).

The process of the present invention comprises altering the surface properties of the metal alloy solder ball by sputtering. The process comprises exposing the solder for a predetermined time period sufficient to energize ions of a sputtering gas and form a surface layer having a desired depth on the solder and having a ratio of tin-to-lead that is less than the bulk ratio. The energized ions may have an energy in the range of about 0.5 to about 10 KeV and the time of exposure may be in the range of about 30 seconds to about 60 minutes, resulting in a surface layer having a depth ranging from about 1,000 Angstroms to about 2 microns.

FIG. 1B shows the result of this process when the solder is hit by ion beam 30. When an ion 44 of the ion beam 30 hits a metal atom, such as Pb atom 42', the metal atom can be sputtered out of the solder as shown in FIG. 1B. The percentage of metal atoms actually sputtered from the solder per contact with an energized ion is referred to as the "sputtering yield." The sputtering yield for Pb is typically four to five times greater than the sputtering yield for Sn. Thus, as the ion beam 30 hits the surface layer 46 of metal alloy solder ball 32, the Pb atoms 42 are preferentially removed.

The resulting mass of solder has a surface layer 46 with a higher ratio of Pb to Sn atoms, while the original homogenous composition remains in the bulk of the mass of solder below the surface layer. Thus, the surface layer becomes Sn-enriched, approaching the same ratio as a eutectic alloy (approximately 1:3 Pb atoms to Sn atoms), while the remainder of the mass of metal alloy solder ball 32 is unchanged.

Thus, the process of the present invention changes the surface layer 46 of metal alloy solder ball 32 in two ways. First, the ratio of Pb to Sn atoms is changed (a chemical change) in surface layer 46. Second, the roughness of the surface layer is also changed (a physical change) from the smooth surface shown in FIG. 1A to the rough surface shown in FIG. 1B. The change in chemical composition to a higher Sn concentration promotes a lower melting temperature. Thus, a lower temperature is required to melt the surface layer 46 for fusing. The bulk solder feature still maintains its shape, however, during high temperature processing such as joining of chips to chip carriers and chip carriers to printed circuit boards. The chemical change also promotes better responsiveness to flux because Sn has a higher reactivity to flux than Pb, while the physical change to a rougher surface promotes the ability to hold more flux. The roughened surface may also be beneficial for certain mechanical interconnection schemes that rely on surface roughness to frictionally hold components together.

The process of the present invention is also reworkable. The solder surface layer 46 can be redistributed into the bulk by a melting operation, regenerating a homogenous mixture with a smooth surface, if required.

Figure 2:
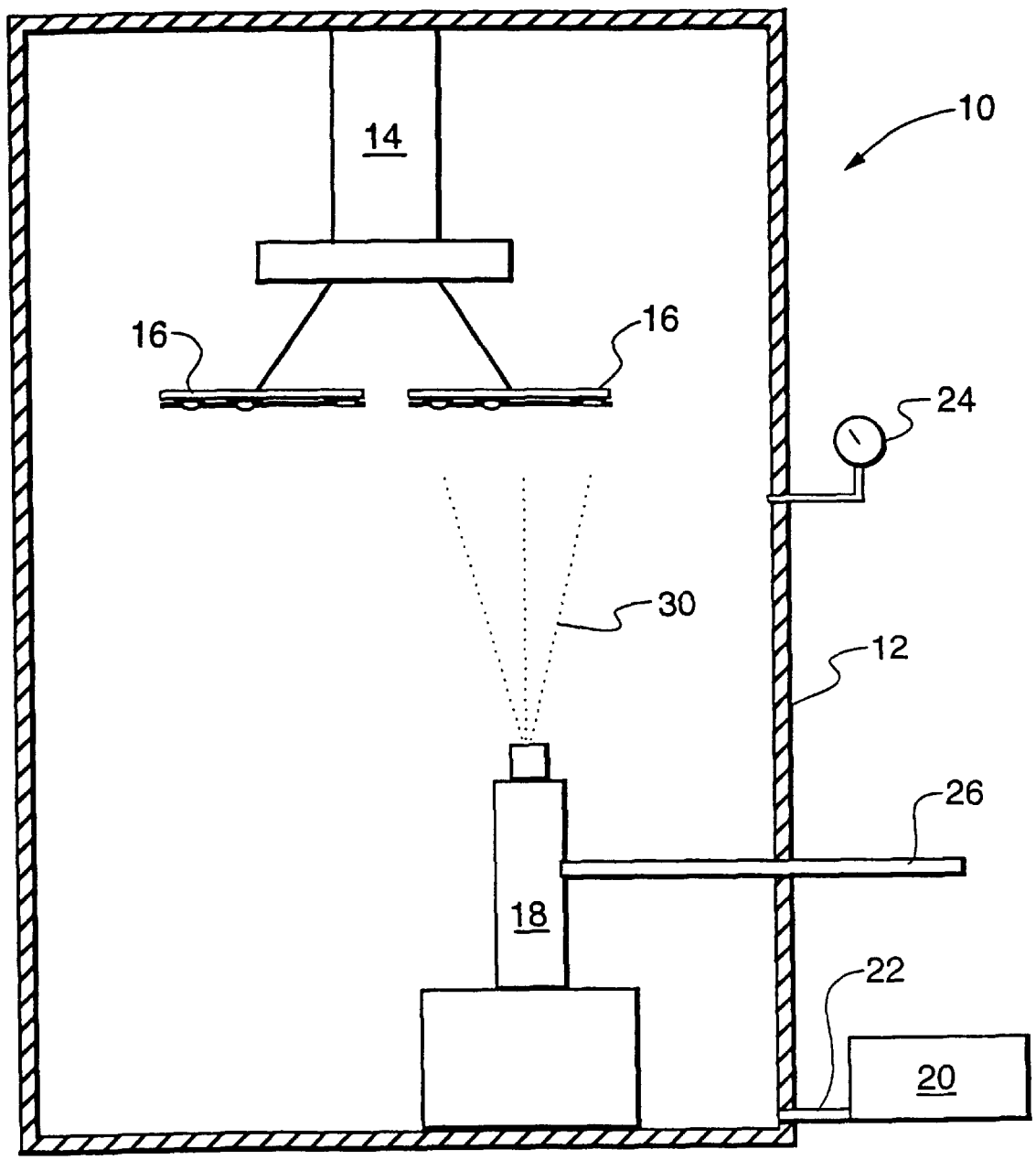
FIG. 2 is a side view illustrating a typical apparatus for carrying out the present invention inside a vacuum chamber, showing substrates held upside-down by a holder in the path of an ion beam directed by an ion gun.

Referring now to FIG. 2, there is shown a sputtering apparatus 10 typical of an apparatus that may be used with the process of the present invention to modify the surface properties of a metal alloy solder by ion bombardment. Vacuum chamber 12 contains a holder 14, for holding substrates 16, and an ion gun 18. As shown in FIG. 2, ion gun 18 directs a stationary ion beam 30 at substrates 16 mounted upside-down on holder 14, while the holder moves the substrates in and out of the beam. Holder 14 as shown in FIG. 2 is a planetary motion device such as that commonly used in chemical vapor deposition (CVD) systems and well known in the art.

A vacuum pump 20 is provided to evacuate vacuum chamber 12 via vacuum hose 22. A vacuum gauge 24 may indicate the amount of vacuum inside the chamber. Sputtering gas is supplied to the ion gun via gas tubing 26.

In operation of apparatus 10, vacuum pump 20 evacuates the vacuum chamber 12 and sputtering gas is supplied to ion gun 18 through gas tubing 26. A plasma (not shown) is generated within the ion gun, in which a voltage grid (not shown) extracts ions from the plasma and accelerates them out of the gun in a directed ion beam 30 that bombards substrates 16 with ions. The amount of exposure time necessary to modify the solder surface depends on the size and strength of the beam, the desired depth of modification, and the surface area of the sample to be treated, and can vary from a fraction of a minute to approximately an hour.

Figure 3:
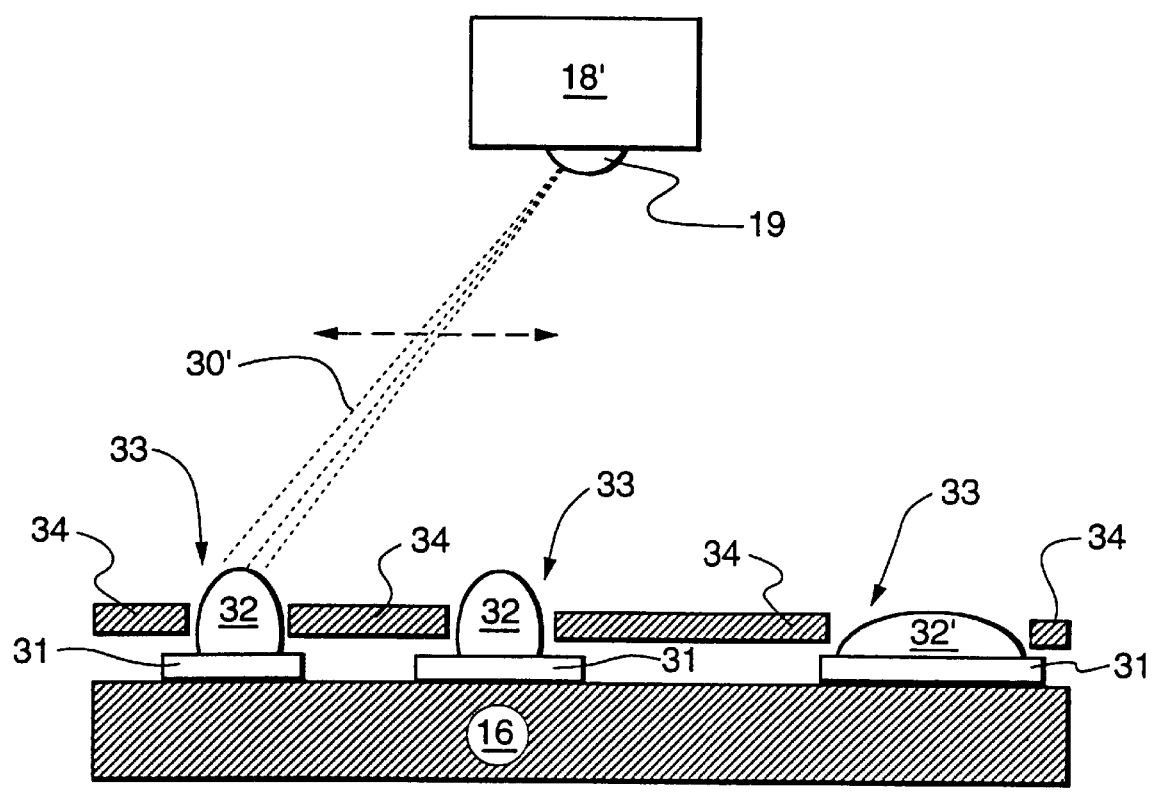
FIG. 3 is a side view illustrating an alternate ion gun embodiment of the present invention being used on a substrate shown right-side-up in cross-section.

Referring now to FIG. 3, there is shown a close-up, cross-sectional side view of a right-side-up substrate 16 and an alternate type of ion gun 18'. Substrate 16 typically is made of a polyamide-, polyimide-, polyester-, or polyethylene-based material or some other organic composition, but may also be made of an inorganic material such as $SiO_2$, $Si_3N_4$, and the like. Substrate 16 has a plurality of metal joining pads 31 on its surface, preferably made of copper, on each of which is deposited a mass of functional solder 32 or process control solder 32'. Process control solder 32' is a test feature deposited on the substrate solely for the purpose of process control. Solder 32' has an area sufficiently large and flat enough to be analyzed by Auger Electron Spectrometry (AES), X-ray Photoelectron Spectroscopy (XPS), or other conventional surface analytical techniques. Such analysis is used to evaluate the solder surface to assess the results of the ion bombardment process.

A mask 34 is placed over substrate 16 to shield from ion beam 30' those portions of the substrate not intended for bombardment with ions. The use of a mask is especially important when exposure to ion beam irradiation is detrimental to the performance of the material surrounding the solder-coated areas. A mask may be omitted if it is desired to simultaneously modify the substrate surface by ion bombardment while the solder surface is modified. When no substrate modification is desired, the mask may cover all of the substrate except the solder masses. As shown in FIG. 3, mask 34 exposes only solder masses 32 and 32' through apertures 33. Alternatively, the mask may cover only the portions of the substrate or attached features sensitive to and not intended for bombardment.

Ion gun 18' shown in FIG. 3 has a head 19 capable of directing a rastered ion beam that can be directed across stationary substrate 16. A rastered beam essentially moves in a line from side-to-side of the substrate starting from one edge, and indexing the width of the beam in a direction perpendicular to the side-to-side motion between each side-to-side pass, so that at the completion of rastering, the beam has covered every portion of the substrate. The ion gun 18' shown in FIG. 3 is also placed within a vacuum chamber (not shown) and supplied with inert gas (not shown) as was the embodiment shown in FIG. 2.

An ion gun apparatus producing a rastered ion beam may also be used in conjunction with a moving sample such as on a conveyor, where a plurality of holders in series each brings one substrate into a position where it is contacted by the ion beam. In such a configuration, the ion beam may merely travel from side-to-side in one direction, while the conveyor provides the indexing motion of the substrates in the perpendicular direction to provide total coverage of the substrate.

Other ion generators may be used instead of ion guns. Ions can be produced in an electrical discharge or plasma, such as an argon plasma. The naturally occurring space charge sheath that develops at all surfaces in contact with the plasma may provide the necessary acceleration of these ions toward the solder surface. Because ions having the highest kinetic energy will generally strike the powered electrode of the plasma generator, the surface to be bombarded may benefit from being placed on the powered electrode. Placement elsewhere in the plasma may be sufficient, however, to produce the desired effect. Thus, a stationary or moving substrate with its associated mask may merely be placed in a plasma for surface preparation of the solder. Nevertheless, to ensure that the ions attain sufficient energy for sputtering metal atoms such as Pb, an ion gun for acceleration and propagation of a beam of ions is preferred.

For small substrates, the entire area to be treated can be irradiated by ions with a stationary substrate and stationary ion beam. For larger substrates, however, it may be necessary to either move the ion irradiation over the area to be treated, such as by rastering a beam of ions as shown in FIG. 3, or to move the substrates through a stationary zone of treatment such as shown in FIG. 2.

The composition of the mask 34 is important. To extend the useful life of the mask and to avoid generation of potential contamination of the substrate 16 by sputtered fragments from the mask, mask erosion must be avoided. This is best accomplished by use of a mask material having a sputtering yield far lower than that of the element to be preferentially sputtered from the alloy being modified. For example, for enrichment of Sn on the surface of Pb—Sn alloys, molybdenum, titanium, and zirconium are desirable mask materials. For ease of mask fabrication, molybdenum is preferred.

The vacuum chamber 12 is fabricated from suitable materials of construction such as aluminum, stainless steel, quartz, chemical and temperature resistant glass, or the like.

Noble gases such as argon are typically used for sputtering applications, and thus are also suitable for Sn enrichment of solder surfaces according to this invention. If simultaneous Sn enrichment and substrate surface chemical treatment are desired, however, high energy ions generated from a reactive gas, such as oxygen, can be used. When oxygen gas is incorporated into the sputtering gas mixture, a significant amount of substrate modification (roughening or incorporation of chemical functional groups of organic material) can be achieved simultaneously with the solder surface modification. Such roughening may be used to improve adhesion between an organic substrate, such as a laminate, and any encapsulating layer, such as a polymer, deposited on the substrate to reinforce the solder joints and to reduce fatigue damage.

Substrate surface roughening simultaneous with solder surface preparation provides an advantage over processes using low-melting point capping of C4 solder. To obtain a roughened, low-melt surface, the capping technologies require both a step to provide the cap and a step to plasma-roughen the substrate, whereas the process of the present invention requires only the plasma step that can both roughen the substrate and prepare the solder surface.

To provide such a reactive plasma, a reactive gas such as oxygen may be introduced to the sputtering application directly into the ion gun 18 or other plasma generator through gas tubing 26 along with inert gas. In an alternate embodiment, a plasma generator external to vacuum chamber 12 may generate the reactive gas ions and pipe the energized ions into the chamber through a dedicated line. In yet another alternate embodiment, a reactive gas plasma generator may be inside the vacuum chamber 12 with its own gas supply piping to provide reactive gas for generating reactive ions from the gas.

In addition to use with Pb—Sn alloys, the present invention may also be used with ternary alloys that contain Sn, Pb, and a third component such as silver (Ag). The process and resulting structure of the present invention may also be extended to alloys comprising metals other than Sn and Pb.

Figure 4:
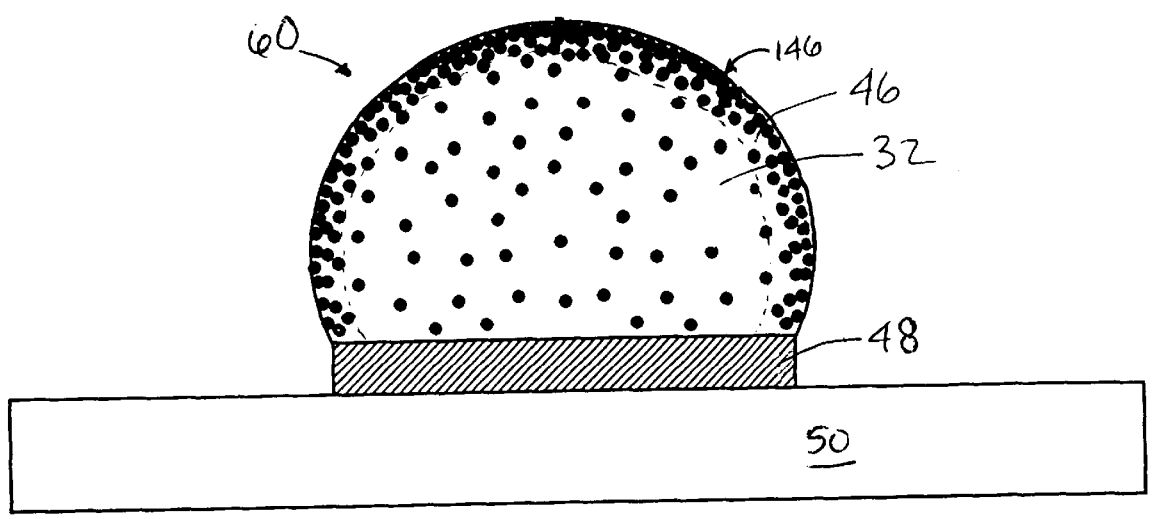
FIG. 4 is a side view cross-sectional illustration depicting Sn concentration along the depth of a solder ball.
Figure 5:
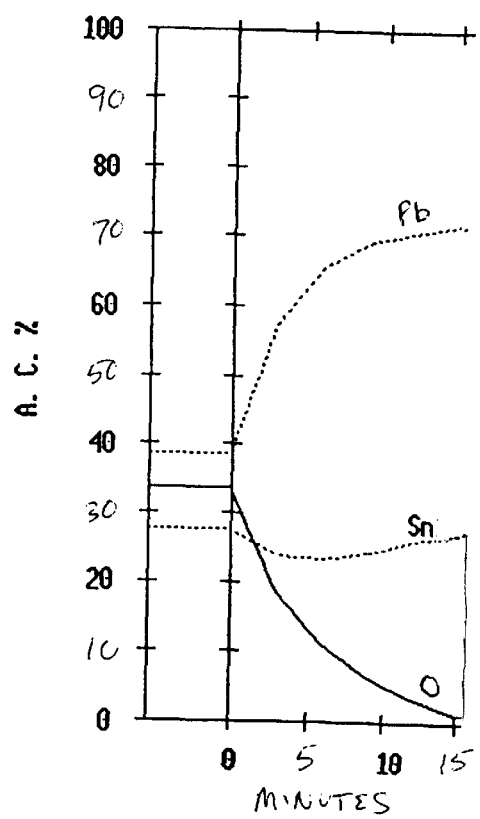
FIG. 5 is a depth profile graph showing sputter time versus atomic concentration for a solder ball of the present invention, as measured by X-Ray Photoelectron Spectroscopy.

It should be understood that the term "layer" as used in this document relates to regions in the metal alloy solder 32 having certain properties, such as being Sn-enriched. For convenience, such regions are illustrated in FIGS. 1A and 1B as being well-defined regions. Such regions are not, however, discrete, homogenous layers. Rather, the regions are layers comprising transitional gradients, such as is shown in FIGS. 4 and 5. For instance, FIG. 4 shows a solder ball 60, mounted on solder pad 48 on substrate 50, having a Sn-enriched surface layer 46 comprising a surface gradient with a greater Sn enrichment (minimum Pb:Sn ratio) at outer surface 146 than close to bulk solder 32. The term "layer" therefore includes such non-homogenous, surface gradients having a Pb:Sn ratio that increases along the depth of the surface gradient from a minimum at the outer surface. In a preferred embodiment, the bulk solder has approximately a 90:10 Pb:Sn weight ratio and the gradient ratio ranges from a minimum of greater than or equal to about 37:63 to a maximum of the bulk ratio. The bulk ratio may be greater than 90:10, such as 97:3, for example.

FIG. 5 illustrates a depth profile of relative atomic concentrations for tin and lead obtained using X-ray Photoelectron Spectroscopy (XPS) for a sample of 90:10 Pb:Sn solder exposed to an argon ion beam in accordance with this invention. The argon ion beam used for enhancing the solder was operated at an energy level of 3 kV and a current of 25 mA at a pressure of $1 \times 10^{-8}$ Torr. XPS can typically sample the surface layer to a depth of about 50 to about 100 Angstroms. FIG. 5 shows the percent concentration of each element: lead (Pb), tin (Sn), and oxygen (O) as a function of sputter time. XPS functions by sputtering away the outer layer of solder while continually measuring the concentration of the outer layer. Thus, the profile of concentration versus sputter time shown in FIG. 5 is essentially a profile of concentration versus depth.

As shown in FIG. 5, the atomic ratio of Pb to Sn is much less at 0 minutes than at 15 minutes. The approximately 38% Pb, 28% Sn, 34% O atomic concentration at 0 (zero) minutes corresponds to approximately a 70:30 Pb:Sn weight ratio on the outer surface of the solder ball, whereas the 70% Pb, 21% Sn, 1% O atomic concentration at 15 minutes corresponds to approximately an 85:15 Pb:Sn weight ratio in the bulk solder. The preferential sputtering rate of Pb during the XPS measurement process skews the measured Pb:Sn ratio lower than the actual 90:10 weight ratio in the bulk, but the 1% (nearly zero) atomic concentration of oxygen at the 15 minute mark indicates that the XPS has reached the bulk solder. FIG. 5 thus depicts the surface gradient of the present invention, showing how the Pb:Sn ratio changes gradually between a minimum at the 0 minute mark to the bulk ratio at approximately the 15 minute mark.

It is further noted that the masses of solder comprise "solder balls" (also sometimes called "solder bumps") as are commonly known in the art. Solder balls are rounded masses of solder, such as result from a reflow step during which a mass of solder tends to ball-up into a rounded surface. Thus, the process of this invention generally is conducted after a reflow step, and typically results in a reflowed solder ball having the surface gradient described above.

EXAMPLES

The following examples are included to more clearly demonstrate the overall nature of the invention. These examples are exemplary, not restrictive, of the invention.

Example 1

A Pb/Sn metal alloy solder sample having a composition of 40% Pb by weight was placed in a vacuum chamber evacuated to $1\times10^{-7}$ to $1\times10^{-8}$ Torr. Using an ion gun and argon as a sputtering gas, an ion beam of 4 KeV argon ions having a raster size of 3×3 mm was directed at the solder. The solder was sequentially sampled over time starting at a fraction of a minute to an hour of exposure to determine the impact of the ion bombardment over time. Sampling was performed by XPS. Ion bombardment was shown to be capable of modifying the surface layer of the 40:60 Pb:Sn alloy to a 23:77 Pb:Sn composition.

Example 2

A eutectic Pb/Sn solder sample was placed in a chamber at 0.13 Torr. A plasma was generated having a total applied power of 6,500–7,000 Watts at 40 KHz, resulting in 0.1 Watts/cm² of powered electrode area, using a gas having a composition of 93% argon and 7% oxygen. The sample was subjected to the plasma treatment for one hour. A significant increase in roughness of the solder balls was recognized in SEM micrographs, and the solder composition changed from the original level of 35:65 Pb:Sn by weight to 15:85 Pb:Sn by weight. The testing showed that, for this example, the oxygen content needed to be below 15%, with less than 10% oxygen being preferred. Higher oxygen levels formed thicker oxide layers that lessened the probability of sputtering. Also, pressures above 0.225 Torr tended to lessen the sputtering effect.

Example 3

A Pb/Sn metal alloy solder sample having a composition of 90% Pb by weight was placed in a vacuum chamber evacuated to 0.085 Torr. A plasma was generated using argon at a flow rate of 14.3 standard cubic centimeters per minute and a 300 Watt power source with 13.56 MHz frequency applied at the cathode, resulting in 0.45 Watts/cm² coverage of the sample. The resulting plasma had an average peak-to-peak ($V_{pp}$) energy of 1,240 Volts and a self-bias or DC-offset ($V_{dc}$) of 200 Volts. The sample was treated for 45 minutes with continuous sampling and analysis to determine the degree of surface change. Over the course of treatment, the Pb/Sn atomic concentration decreased.

Although illustrated and described with reference to certain specific embodiments, the present invention is nevertheless not intended to be limited to the details shown. Rather, various modifications may be made in the details within the scope and range of equivalents of the claims and without departing from the spirit of the invention.

What is claimed:

1. A metal alloy solder ball having an outer surface and comprising a first metal and a second metal, the metal alloy solder ball having a bulk ratio of the first metal to the second metal in a bulk portion, the first metal having a sputtering yield greater than the second metal, the metal alloy solder ball comprising a product produced by a process for altering surface properties of the metal alloy solder ball, the process comprising:
   exposing the metal alloy solder ball to energized ions of a sputtering gas for an effective amount of time to form a surface gradient having a depth and a gradient ratio of the first metal to the second metal that is less than the bulk ratio, the gradient ratio increasing gradually along the surface gradient depth from a minimum at the outer surface.

2. A metal alloy solder ball comprising:
   a first metal and a second metal, the first metal having a sputtering yield greater than the second metal;
   a bulk portion having a bulk ratio of the first metal to the second metal; and
   a surface gradient between an outer surface of the solder ball and said bulk portion, the surface gradient having a depth and a gradient ratio of the first metal to the second metal that is less than the bulk ratio, the gradient ratio increasing gradually along with surface gradient depth from a minimum at the outer surface.

3. The metal alloy solder ball of claim 2 wherein the outer surface is rough as compared to an outer surface of an otherwise identical solder ball that has not undergone a roughening step.

4. The metal alloy solder ball of claim 2 wherein the solder ball comprises a reflowed solder ball on which the surface gradient has been formed after a reflow process.

5. The metal alloy solder ball of claim 2 wherein the second metal is tin.

6. The metal alloy solder ball of claim 5 wherein the first metal is lead.

7. The metal alloy solder ball of claim 6 wherein the second metal is tin.

8. The metal alloy solder ball of claim 7 wherein the gradient ratio has a minimum of greater than or equal to about 37:63 lead:tin by weight.

9. The metal alloy solder ball of claim 8 wherein the bulk ratio is greater than or equal to about 90:10 lead:tin by weight.

10. A metal alloy solder ball comprising:
    lead and tin, the lead having a sputtering yield greater than the tin;
    a bulk portion having a bulk ratio greater than or equal to about 90:10 lead:tin by weight;
    a rough outer surface as compared to an outer surface of an otherwise identical solder ball that has not undergone a roughening step; and
    a surface gradient between the outer surface of the solder ball and the bulk portion, the surface gradient having a depth and a gradient ratio of the lead to the tin that is less than the bulk ratio, the gradient ratio increasing gradually along with surface gradient depth from a minimum at the outer surface.

11. The metal alloy solder ball of claim 10 wherein the solder ball comprises a reflowed solder ball on which the surface gradient has been formed after a reflow process.

12. The metal alloy solder ball of claim 10 wherein the gradient ratio has a minimum of greater than or equal to about 37:63 lead:tin by weight.

* * * * *